United States Patent
Gouk et al.

(10) Patent No.: US 10,879,116 B2
(45) Date of Patent: Dec. 29, 2020

(54) METHOD FOR COPPER PLATING THROUGH SILICON VIAS USING WET WAFER BACK CONTACT

(71) Applicant: APPLIED MATERIALS, INC., Santa Clara, CA (US)

(72) Inventors: Roman Gouk, San Jose, CA (US); Steven Verhaverbeke, San Francisco, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 265 days.

(21) Appl. No.: 14/896,854

(22) PCT Filed: May 27, 2014

(86) PCT No.: PCT/US2014/039611
§ 371 (c)(1),
(2) Date: Dec. 8, 2015

(87) PCT Pub. No.: WO2014/204620
PCT Pub. Date: Dec. 24, 2014

(65) Prior Publication Data
US 2016/0133515 A1    May 12, 2016

Related U.S. Application Data

(60) Provisional application No. 61/835,972, filed on Jun. 17, 2013.

(51) Int. Cl.
*H01L 21/44* (2006.01)
*H01L 21/768* (2006.01)
(Continued)

(52) U.S. Cl.
CPC .... *H01L 21/76879* (2013.01); *C23C 18/1653* (2013.01); *C23C 18/34* (2013.01);
(Continued)

(58) Field of Classification Search
CPC ......... H01L 21/76879; H01L 21/76847; H01L 21/76898; H01L 21/2885;
(Continued)

(56) References Cited

U.S. PATENT DOCUMENTS 4,321,283 A    3/1982  Patel et al.
7,659,203 B2   2/2010  Stewart et al.
(Continued)

FOREIGN PATENT DOCUMENTS

CN    1610066 A     4/2005
JP    2003145354 A  5/2003
(Continued)

OTHER PUBLICATIONS

International Search Report and Written Opinion, PCT/US2014/039611, dated Sep. 26, 2014.
(Continued)

*Primary Examiner* — Julio J Maldonado
*Assistant Examiner* — Stanetta Isaac
(74) *Attorney, Agent, or Firm* — Patterson + Sheridan, LLP

(57) ABSTRACT

A method and apparatus for processing a substrate are provided. In some implementations, the method comprises providing a silicon substrate having an aperture containing an exposed silicon contact surface at a bottom of the aperture, depositing a metal seed layer on the exposed silicon contact surface and exposing the substrate to an electroplating process by flowing a current through a backside of the substrate to form a metal layer on the metal seed layer.

14 Claims, 5 Drawing Sheets

(51) Int. Cl.
*H01L 21/288* (2006.01)
*C25D 7/12* (2006.01)
*C23C 18/16* (2006.01)
*C23C 18/34* (2006.01)
*C25D 3/38* (2006.01)
*C25D 3/40* (2006.01)
*C25D 17/00* (2006.01)

(52) U.S. Cl.
CPC .......... *C25D 7/123* (2013.01); *H01L 21/2885* (2013.01); *H01L 21/76847* (2013.01); *H01L 21/76898* (2013.01); *C25D 3/38* (2013.01); *C25D 3/40* (2013.01); *C25D 17/001* (2013.01)

(58) Field of Classification Search
CPC ... H01L 2224/13075; H01L 2224/1354; H01L 2224/29075; C23C 18/34; C23C 18/1653; C25D 7/123; C25D 3/40; C25D 3/38; C25D 17/001
See application file for complete search history.

(56) References Cited

U.S. PATENT DOCUMENTS

| | | | |
|---|---|---|---|
| 8,308,858 B2 | 11/2012 | Stewart et al. | |
| 2005/0189233 A1* | 9/2005 | Shih | C25D 3/38 |
| | | | 205/296 |
| 2007/0071888 A1 | 3/2007 | Shanmugasundram et al. | |
| 2007/0125657 A1* | 6/2007 | Sun | C25D 3/38 |
| | | | 205/205 |
| 2007/0128868 A1 | 6/2007 | Halahan et al. | |
| 2007/0190362 A1 | 8/2007 | Weidman | |
| 2010/0015805 A1 | 1/2010 | Mayer et al. | |
| 2012/0100715 A1 | 4/2012 | Takahashi et al. | |
| 2012/0152751 A1* | 6/2012 | Baskaran | C25D 3/38 |
| | | | 205/98 |
| 2014/0174936 A1* | 6/2014 | Hamm | H01L 21/288 |
| | | | 205/91 |
| 2014/0217590 A1 | 8/2014 | Nalla et al. | |

FOREIGN PATENT DOCUMENTS

| | | |
|---|---|---|
| KR | 20080063613 A | 7/2008 |
| KR | 10-2011-0028446 A | 3/2011 |
| KR | 20110064828 A | 6/2011 |

OTHER PUBLICATIONS

Zhang, Xi, et al., "Immersion Nickel Deposition on Blank Silicon in Aqueous Solution Containing Ammonium Fluoride," Thin Solid Films 515 (2007) 4696-4701, Dec. 26, 2006.
Search Report for Chinese Application No. 201480032592.3 (APPM/020921CNP) dated Mar. 28, 2018.
Office Action issued in corresponding to Korean Patent Application No. 10-2016-7001114, dated Aug. 6, 2020 (5 pages).

* cited by examiner

METHOD FOR COPPER PLATING THROUGH SILICON VIAS USING WET WAFER BACK CONTACT

BACKGROUND

Field

Implementations of the present disclosure generally relate to methods for depositing materials on substrates, and more specifically to methods for filling features having high aspect ratios.

Description of the Related Art

Multilevel, 45 nm node metallization is one of the key technologies for the next generation of very large scale integration (VLSI). The multilevel interconnects that lie at the heart of this technology possess high aspect ratio features, including contacts, vias, lines, and other apertures. Reliable formation of these features is very important for the success of VLSI and the continued effort to increase quality and circuit density on individual substrates. Therefore, there is a great amount of ongoing effort being directed to the formation of void-free features having high aspect ratios of 20:1 (height:width) or greater.

Copper and tungsten are choice metals for filling VLSI features, such as a submicron high aspect ratio contacts (HARC) on a substrate. Contacts are formed by depositing a conductive interconnect material, such as copper or tungsten into an aperture (e.g., via) on the surface of an insulating material disposed between two spaced-apart conductive layers. A high aspect ratio of such an opening may inhibit deposition of a conductive interconnect material to fill an aperture. Although copper and tungsten are popular interconnect materials, deposition processes for depositing these materials may suffer by forming a void or a seam within the contact plug.

Therefore, a need exists for a method to fill a feature with a conductive contact material, such that the contact material is deposited free of voids, seams, and other defects.

SUMMARY

Implementations of the present disclosure generally relate to methods for depositing materials on substrates, and more specifically to methods for filling features having high aspect ratios. In one implementation, a method for depositing a material on a substrate is provided. The method comprises providing a silicon substrate having an aperture containing an exposed silicon contact surface at a bottom of the aperture, depositing a metal seed layer on the exposed silicon contact surface at the bottom of the aperture and exposing the substrate to an electroplating process by flowing a current through a backside of the substrate to form a metal layer on the metal seed layer. In some implementations, exposing the substrate to an electroplating process by flowing a current through the backside of the silicon substrate to form a metal layer on the metal seed layer comprises exposing the backside of the substrate to a wet contact solution comprising a hydrofluoric acid solution and exposing the seed layer to a copper containing solution.

In another implementation, a method for depositing a material on a substrate is provided. The method comprises providing a silicon substrate having a field region, a backside, and a feature extending from the field region toward the backside, the feature having at least one sidewall and a bottom surface, depositing a conformal barrier layer over the field region, the at least one sidewall and the bottom surface, removing a portion of the conformal barrier layer from the bottom surface of the feature to expose the silicon substrate, depositing a metal seed layer at the bottom surface of the feature on the exposed silicon, and exposing the substrate to an electroplating process by flowing a current through the backside of the silicon substrate to form a metal layer on the metal seed layer.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1A:
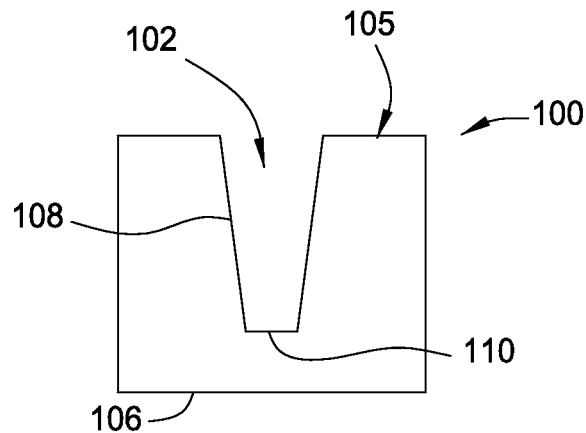
FIGS. 1A-1F illustrate schematic cross-sectional views of a through silicon via (TSV) fabrication process according to implementations described herein.

To facilitate understanding, identical reference numerals have been used, wherever possible, to designate identical elements that are common to the figures. It is contemplated that elements and/or process blocks of one implementation may be beneficially incorporated in other implementations without additional recitation.

DETAILED DESCRIPTION

Implementations of the present disclosure generally relate to methods for depositing materials on substrates, and more specifically to methods for filling high aspect ratio features. Implementations described herein are especially advantageous in through-silicon via (TSV) applications. Implementations of the methods described herein are also suitable for plating applications on standard substrates. TSV applications include electrical connections passing completely through a silicon substrate, such as in 3D packages and 3D integrated circuits. TSV applications commonly include multiple integrated circuits disposed on one another. For example, a 3D integrated circuit may include multiple silicon substrates stacked vertically on one another.

Some implementations described herein relate to copper plating of TSVs. Conventional plating processes are insufficient for plating copper in high aspect ratio (AR~20-50) TSVs due to lack of conformality of the as-deposited copper materials. To partially improve copper plating conformality and stimulate bottom-up plating various additives are added typically added to the copper plating chemistry. However, the addition of such additives drastically reduces the plating rate. Therefore, it is desirable to plate with a simple copper containing chemistry with minimum additives in order to maximize the copper plating rate.

In some implementations described herein, methods for bottom-up via plating using wet wafer backside contact are used to achieve conformal copper deposition at high plating rates. In some implementations, a metallic film or silver paste is applied to the backside of the substrate to allow for current to flow through the substrate. However, use of silver past or metallic films adds complexity to the process.

The methods and structures described herein may be performed in individual chambers, respectively coupled to, or part of, an integrated processing tool, such as a cluster tool. Examples of the integrated tools include the CENTURA® and ENDURA® integrated tools, both available from Applied Materials, Inc., of Santa Clara, Calif. In one implementation, the cluster tool may have processing chambers that are configured to perform a number of substrate processing operations such as cyclical layer deposition, chemical vapor deposition (CVD), physical vapor deposition (PVD), atomic layer deposition (ALD), etch, pre-clean, degas, anneal, orientation and other substrate processes.

FIGS. 1A-1F illustrate a schematic cross-sectional view of a feature 102 as the various processing blocks of a processing sequence 200 (FIG. 2) are performed on a substrate 100. At block 210, a feature 102 is formed in the substrate 100 as depicted in FIG. 1A. FIG. 1A illustrates a cross-sectional view of the substrate 100 having a field region 105, a backside 106 and the feature 102 formed into a surface of the substrate 100. The feature 102 has at least one sidewall 108 and a bottom surface 110. The feature 102 may include apertures such as contact holes, vias, or trenches. In some implementations where the aperture is a via, the via has a high aspect ratio (e.g., AR~20-50). The substrate 100 may comprise a semiconductor material such as, for example, silicon, germanium, or silicon germanium. The feature 102 may be formed in the substrate 100 using conventional lithography and etching techniques. In some implementations, the feature 102 may be formed using a pulsed or time-multiplexed etching process, such as the Bosch process.

Figure 1B:
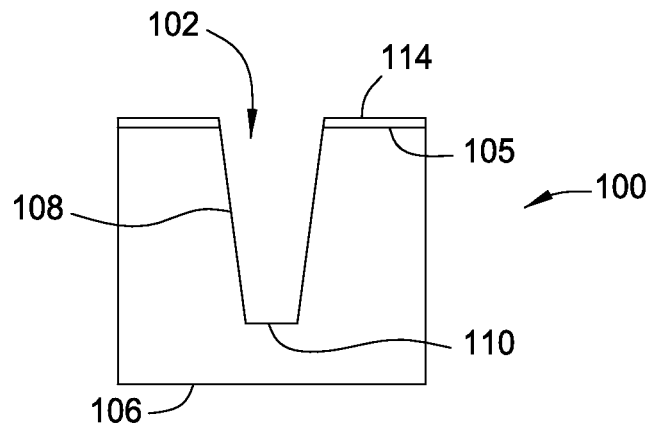
Figure 2:
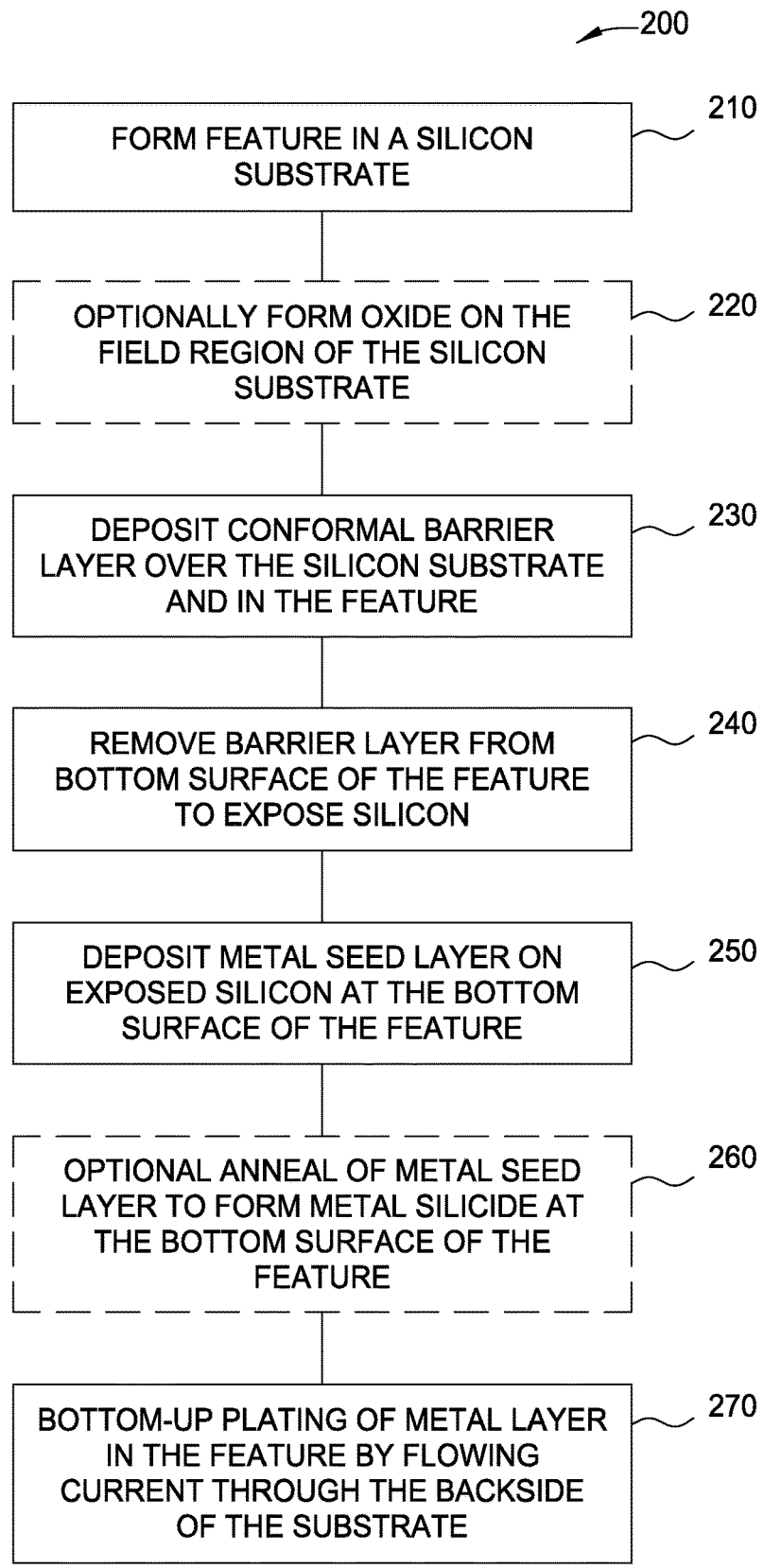
FIG. 2 illustrates a flow chart depicting a deposition process according to implementations described herein.

Optionally, at block 220, a thin oxide layer 114 is formed on the field region 105 of the substrate 100 as depicted in FIG. 1B. The thin oxide layer 114 may have a thickness from about 500 Å and about 1,000 Å. The thin oxide layer 114 may be an oxide containing silicon layer (e.g., $SiO_2$, SiO). The oxide layer may be formed on the field region 105 by exposing the substrate 100 to a cleaning process. In some implementations, the optional clean process may comprise exposing the substrate 100 to Standard Clean-1 ("SC-1") chemistry (e.g., a 1:1:5 solution of $NH_4OH$ (ammonium hydroxide)+$H_2O_2$ (hydrogen peroxide)+$H_2O$ (water) at 75 or 80 degrees Celsius typically for 10 minutes). The optional pre-clean process may further comprise at least one of exposure to a hydrofluoric acid containing solution and a Standard Clean 2 ("SC-2") chemistry (e.g., a 1:1:6 solution of $HCl+H_2O_2+H_2O$ at 75 or 80 degrees Celsius). In some implementations, the thin oxide layer 114 may be formed on the field region using deposition techniques such as chemical vapor deposition (CVD).

Figure 1C:
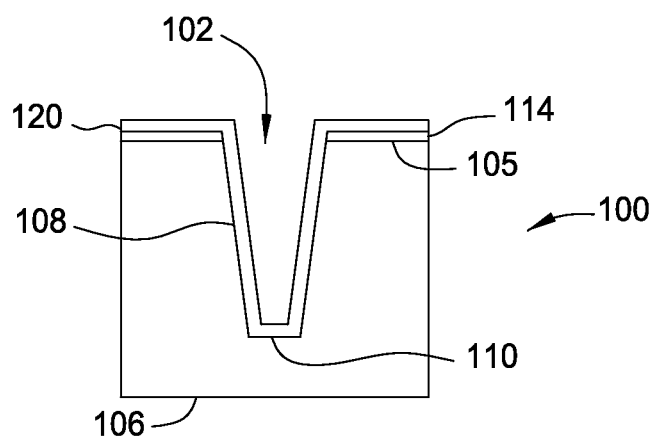

At block 230, to prevent copper diffusion into the substrate 100, a conformal barrier layer 120 may be formed over the field regions 105 of the substrate 100 and in feature 102, as depicted in FIG. 1C. Barrier layer 120 may be formed using a suitable deposition process including atomic layer deposition (ALD), chemical vapor deposition (CVD), physical vapor deposition (PVD) or combinations thereof. In one implementation, the barrier layer 120 may be formed by a chamber of a cluster tool. In one implementation, the substrate 100 may be placed into a plasma enhanced ALD (PE-ALD), a plasma enhanced CVD (PE-CVD) or high density plasma CVD (HDP-CVD) chamber, such as the ULTIMA HDP-CVD™ Centura iSprint™ or Endura iLB™ systems, available from Applied Materials Inc., located in Santa Clara, Calif.

In one implementation, the barrier layer 120 may formed using a physical vapor deposition (PVD), chemical vapor deposition (CVD) or atomic layer deposition (ALD) deposition process. The barrier layer 120 may be a single deposited layer, or multiple deposited layers, containing ruthenium (Ru), titanium (Ti), titanium nitride (TiN), tungsten (W), tungsten nitride (WN), tantalum (Ta), tantalum nitride (TaN) or other alloy containing these materials. In some implementations, the single deposited layer or multiple deposited layer stack may contain an oxide layer. In some implementations, the oxide layer may be oxide layer 114 as depicted in FIG. 1B. The oxide layer may be a silicon oxide or a silicon dioxide containing layer. The silicon oxide or silicon dioxide layer may serve as an insulating layer. The silicon oxide or silicon dioxide layer may be deposited using a CVD process. In one implementation, the multiple deposited layer stack may have a first layer that contains silicon dioxide and a second layer that contains TaN. The silicon dioxide may be derived from tetraethyl orthosilicate (TEOS). In some implementations, the deposited barrier layer 120 may be from about 500 Å to about 2,000 Å thick. In some implementations, the deposited barrier layer 120 may be from about 1,000 Å to about 1,500 Å thick.

In some implementations where oxide layer 114 is present, the barrier layer 120 is deposited over oxide layer 114. In some implementations where 114 is not present, barrier layer 120 is deposited directly on the field region 105.

Figure 1D:
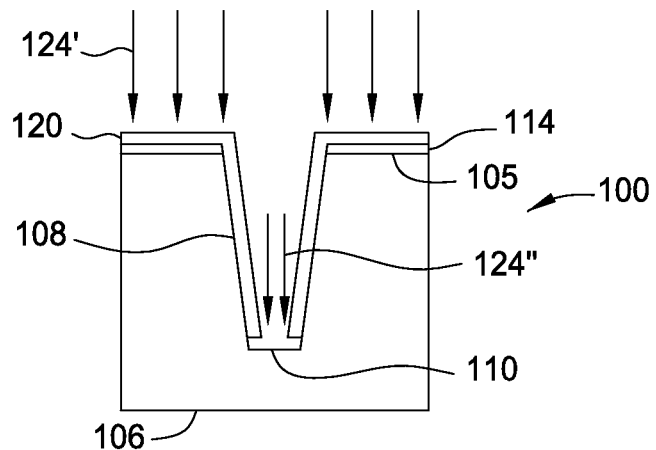

At block 240, a portion of the barrier layer 120 is removed to expose the bottom surface 110 of feature 102, as depicted in FIG. 1D. The barrier layer may be removed from the bottom surface 110 using an etching process, for example, a reactive ion etching process or a sputtering etching process. In some implementations, the exposed surfaces of the barrier layer 120 may be directionally etched to remove the barrier layer 120 from the bottom surface 110 of feature 102 exposing the silicon material of the silicon substrate 100. The barrier layer 120 on the field region 105 of the silicon substrate 100 may be thinned or completely removed during the directional etching process. The arrows 124' represent the direction of gas ion movement, due to the generation of an electric field near the substrate surface of the substrate during processing, which causes the argon gas to collide with the top (planar) surface of the barrier layer 120 during the directional etch process. The arrows 124" similarly show the direction of the gas ion movement at the bottom surface 110 of the feature 102. The barrier layer 120 along the side wall 108 may be thinned but is substantially unaffected by the etch process and so the barrier layer 120 deposited over the side wall 108 remains intact after the etch process is completed. Although the remaining thin barrier layer 120 may provide a conductive path, the resistance of the thin barrier layer is typically very high and as a result, there won't be a significant amount of plating on the field region 105 and/or sidewall 108, thus providing for bottom-up fill.

Figure 1E:
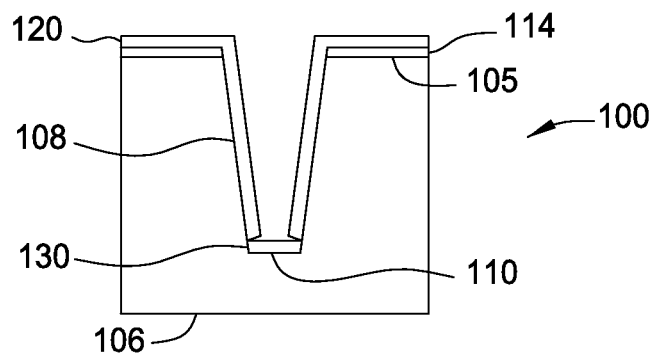

At block 250, a metal seed layer 130 is deposited on the exposed silicon at the bottom surface 110 of the feature 102 as depicted in FIG. 1E. The metal seed layer 130 may be deposited on the bottom surface 110 using a physical vapor deposition (PVD), chemical vapor deposition (CVD), electroless deposition or atomic layer deposition (ALD) deposition processes. In some implementations, the metal seed layer 130 deposition process may be conducted in the same deposition chamber as the barrier layer deposition process, described above. In some implementations, the metal seed layer 130 may be a copper (Cu) layer, a ruthenium (Ru) layer, a palladium (Pd) layer, a nickel (Ni) layer, a cobalt (Co) layer, or a layer that is an alloy containing one or more of these elements. In some implementations, the deposited metal seed layer 130 is from about 10 nm to about 250 nm thick. In some implementations, the deposited metal seed layer 130 is from about 100 nm to about 200 nm thick.

In some implementations, where the metal seed layer 130 is a nickel layer, the nickel layer may be deposited using an electroless plating process. Preparation of the silicon surface may include at least one of a hydrofluoric acid etch and an SC-1 dip to re-grow chemical oxide which is believed to produce better adhesion. The electroless nickel plating solution may comprise a nickel source (e.g., $NiSO_4$), a reducing agent (e.g., $NH_4F$), and DI water. The electroless plating solution may have pH from about 5 to about 6. The electroless nickel deposition process may be performed at a temperature of 95 degrees Celsius or greater with optional agitation such as impalement stirring or sonication.

At block 260, optionally, the metal seed layer 130 may be annealed to form a metal silicide layer (not shown) at the bottom surface 110 of the feature 102. The metal silicide layer comprises at least a portion of the metal seed layer 130 and at least a portion of the silicon containing substrate 100. Exemplary annealing processes include thermal annealing processes (e.g., RTP), laser annealing processes, such as millisecond annealing processes, nanosecond annealing processes, and microsecond annealing processes and flash lamp annealing processes. The metal silicide layer may be formed by annealing at a temperature within a range from about 400 degrees Celsius to less than 1,200 degrees Celsius. The metal silicide layer may be formed by annealing at a temperature within a range from about 700 degrees Celsius to less than 1,000 degrees Celsius.

Figure 1F:
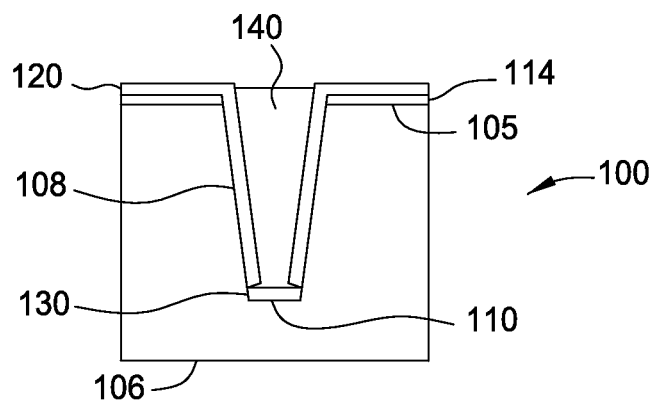

At block 270, bottom-up filling of the feature 102 with a metal layer 140 by an electroplating process by flowing current through the backside 106 of the substrate 100, as depicted in FIG. 1F. In some implementations, the feature 102 is preferentially filled from the metal seed layer 130 at the bottom of the feature 102 until the layer is about level with the field region 105 (e.g., bottom-up fill). In some implementations, the metal layer 140 may be a copper (Cu) layer, a cobalt (Co) layer, a nickel (Ni) layer, a silver (Ag) layer or a layer that is an alloy containing one or more of these elements. In some implementations, the feature 102 is filed using a multilayer fill process in which two or more layers are sequentially deposited to fill the feature 102. An exemplary bottom-up fill electroplating process is described below with reference to FIG. 3 and FIG. 4. In general, the metal layer 140 may be deposited using an electroplating deposition solution that contains one or more metal ion sources that allows the deposition of a layer that contains one or more metals. In one implementation, one of the metals ions is a copper ion and the other metal ion(s) are a metal selected from a group consisting of aluminum (Al), indium (In), molybdenum (Mo), tungsten (W), manganese (Mn), cobalt (Co), tin (Sn), nickel (Ni), magnesium (Mg), rhenium (Rh), beryllium (Be), phosphorus (P), boron (B), gallium (Ga), or ruthenium (Ru). In some implementations, a current of from about 0.5 Amps to 2 Amps is used. In some implementations, the deposition bias generally has a current density of from about 0.0005 $A/cm_2$ and about 0.01 $A/cm^2$ or less.

In some implementations of the processing sequence 200, the barrier layer 120 may be removed from the field region 105 by use of a material removal process, such as an electrochemical process or chemical mechanical polishing process (CMP). In some implementations, where the barrier layer 120 may be removed from the field region 105 during the process of block 240. In some implementations, this process block includes the process of removing any over plating leftover after performing the deposition of the metal layer 140. The substrate 100 may also be exposed to a cleaning process to remove any plating solution and or wet contact solution. The cleaning process may comprise at least one of a spine, a rinse, and a dry.

Figure 3:
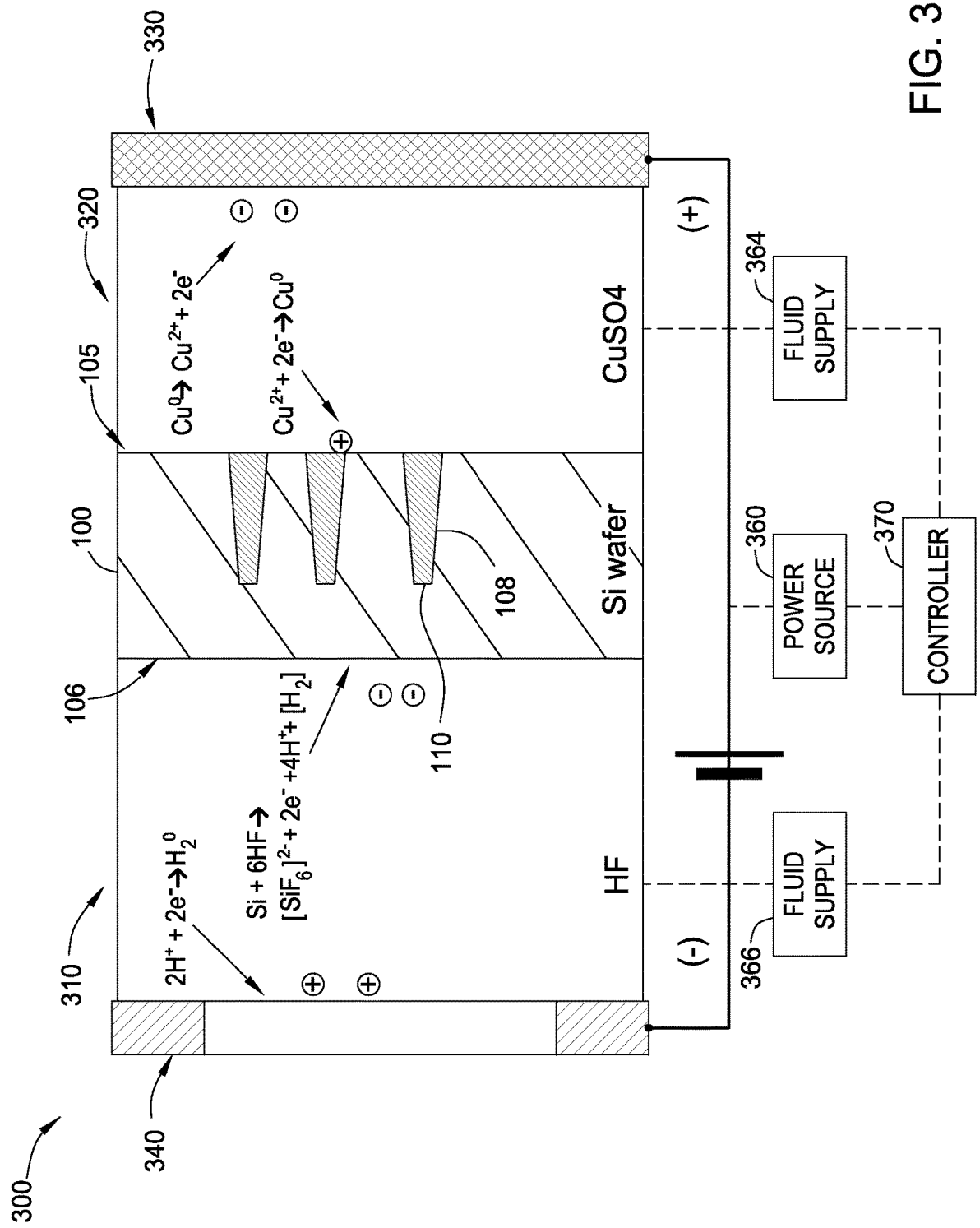
FIG. 3 illustrates a schematic cross-sectional view of a plating cell that may be used to perform the deposition processes described herein.
Figure 4:
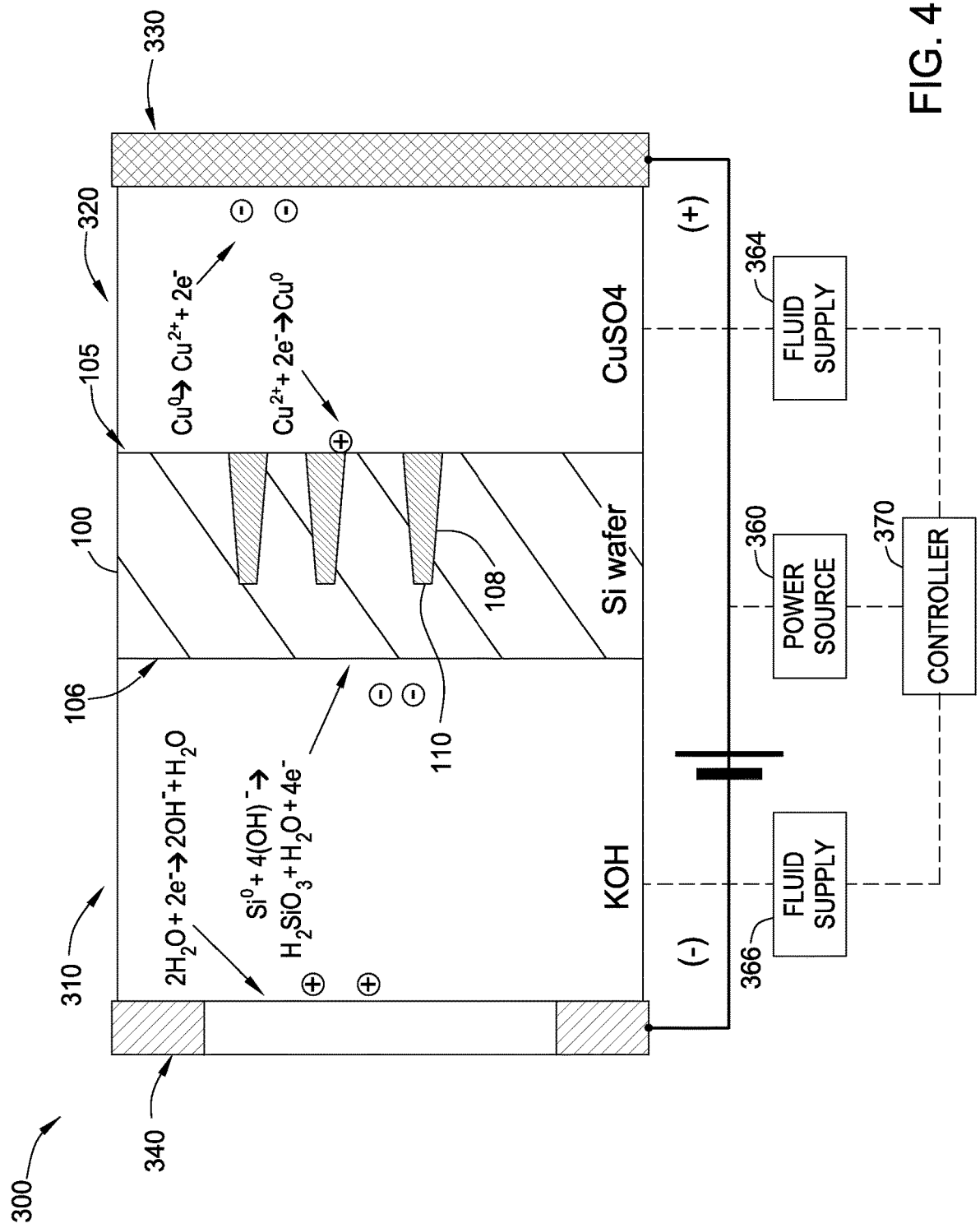
FIG. 4 illustrates another schematic cross-sectional view of a plating cell that may be used to perform the deposition processes described herein.

FIG. 3 illustrates a schematic cross-sectional view of a plating cell 300 that may be used to perform the deposition processes described herein. FIG. 4 illustrates another schematic cross-sectional view of a plating cell 300 that may be used to perform the deposition processes described herein. The plating cell 300 of FIG. 3 and the plating cell 300 of FIG. 4 are identical except for the wet contact solutions used. It should also be understood that the wet contact solutions depicted in FIG. 3 and FIG. 4 are exemplary. The plating cell 300 comprises a wet contact solution compartment 310 and a plating solution compartment 320 with the substrate 100 positioned therebetween. Although the plating cell 300 is depicted in FIG. 3 as having a vertical orientation (i.e., the substrate has a vertically orientation), it should also be understood that the plating cell may have a horizontal orientation with the wet contact solution compartment 310 positioned under the plating solution compartment 320.

A soluble anode 330 is positioned within the plating solution compartment 320. The soluble anode 330 typically comprises the material to be plated on the substrate 100. For example, in some implementations where copper is plated on the substrate 100, the soluble anode comprises copper and supplies copper ions to the plating solution in the plating solution compartment 320.

An insoluble electrode 340 is positioned within the wet contact solution compartment. The insoluble electrode typically comprises a material that is inert relative to the process chemistry in the wet contact solution compartment. In some implementations, the insoluble electrode 340 comprises boron doped carbon (BDC).

The plating cell 300 may be coupled to a power source 360 for supplying power to the various components of the plating cell 300. The power source 360 may be an RF or DC source. The power source 360 may be coupled with a controller 370. The controller 370 may be coupled with the plating cell 300 to control operation of the plating cell 300. The controller 370 may include one or more microprocessors, microcomputers, microcontrollers, dedicated hardware or logic, and a combination of the same.

The plating solution compartment 320 may be coupled with a first fluid supply 364 for supplying a pre-mixed plating solution or the precursors for forming the plating solution to the plating solution compartment 320. The wet contact solution compartment 310 may be coupled with a second fluid supply 366 for supplying the wet contact solution and any additional additives to the wet contact solution compartment 310.

In some implementations, the wet contact solution comprises a conductive solution capable of delivering current to the backside of the substrate. In some implementations, the wet contact solution comprises an electrolyte. In some implementations the wet contact solution comprises a conductive acid. It is believed that the conductive acid removes silicon from the backside of the wafer and provides current flow between the wafer and the electrode. One exemplary conductive acid is hydrofluoric acid. Hydrofluoric acid may be from about 10% (w/w) aqueous solution to about 49% (w/w) aqueous solution. The wet contact solution may comprise additional salts in order to increase the conductivity of the solution. Exemplary additional salts include potassium fluoride. In one implementation, the wet contact solution comprises a hydrofluoric acid solution, aqueous, (49%) and potassium fluoride.

In some implementations, the wet contact solution comprises a conductive base. In some implementations, the conductive base is potassium hydroxide (KOH). Conductive bases such as KOH typically do not cause porous silicon formation and exhibit low etch rates (46 Å/min) for silicon of 111 crystal orientation. Conductive bases such as KOH can also etch $SiO_2$ at elevated temperature at ~15 A/min sufficient to provide wet contact. Experimental results confirmed improved plating current stability as function of time with a KOH based wet contact solution. It is believed that use of a conductive base (e.g., KOH) prevents plating current loss that may occur due to formation of porous silicon on the wafer backside when conductive acids are used.

Plating Solution:

In one implementation, the plating solution contains a metal ion source and at least one or more acid solutions. In some implementations, the plating solution is an electroplating solution. In other implementations, the plating solution is an electroless plating solution. Suitable acid solutions include, for example, inorganic acids such as sulfuric acid, phosphoric acid, pyrophosphoric acid, hydrochloric acid, perchloric acid, acetic acid, citric acid, combinations thereof, as well as acid electrolyte derivatives, including ammonium and potassium salts thereof.

In some implementations, the metal ion source within the plating solution is a copper ion source. Useful copper sources include copper sulfate ($CuSO_4$), copper (I) sulfide ($Cu_2S$), copper (II) sulfide (CuS), copper (I) chloride (CuCl), copper (II) chloride ($CuCl_2$), copper acetate (Cu($CO_2CH_3$)$_2$), copper pyrophosphate ($Cu_2P_2O_7$), copper fluoroborate (Cu($BF_4$)$_2$), copper acetate (($CH_3CO_2$)$_2$Cu), copper acetylacetonate (($C_5H_7O_2$)$_2$Cu), copper phosphates, copper nitrates, copper carbonates, copper sulfamate, copper sulfonate, copper pyrophosphate, copper cyanide, derivatives thereof, hydrates thereof or combinations thereof. Some copper sources are commonly available as hydrate derivatives, such as $CuSO_4 5H_2O$, $CuCl_2 2H_2O$ and $(CH_3CO_2)_2CuH_2O$. The electrolyte composition can also be based on the alkaline copper plating baths (e.g., cyanide, glycerin, ammonia, etc.) as well. In one implementation, the concentration of copper ions in the electrolyte may range from about 0.1 M to about 1.1M. In one implementation, the concentration of copper ions in the electrolyte may range from about 0.4 M to about 0.9 M.

Optionally, the plating solution may include one or more additive compounds. In some implementations, the plating solution contains an oxidizer. As used herein, an oxidizer may be used to oxidize a metal layer to a corresponding oxide, for example, copper to copper oxide. Examples of suitable oxidizers include peroxy compounds, e.g., compounds that may disassociate through hydroxyl radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and di-t-butyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used. In some implementations, the oxidizer can be present in the plating solution in an amount ranging between about 0.001% and about 90% by volume or weight. In another implementation, the oxidizer can be present in the plating solution in an amount ranging between about 0.01% and about 20% by volume or weight. In yet another implementation, the oxidizer can be present in the plating solution in an amount ranging between about 0.1% and about 15% by volume or weight.

In some implementations, it is desirable to add a low cost pH adjusting agent, such as potassium hydroxide (KOH) or sodium hydroxide (NaOH) to form an inexpensive electrolyte that has a desirable pH to reduce the cost of ownership required to form an energy device. In some implementations it is desirable to use tetramethylammonium hydroxide (TMAH) to adjust the pH.

In some implementations, it may be desirable to add a second metal ion to the primary metal ion containing electrolyte bath (e.g., copper ion containing bath) that will plate out or be incorporated in the growing electrochemically deposited layer or on the grain boundaries of the electrochemically deposited layer. The formation of a metal layer that contains a percentage of a second element can be useful to reduce the intrinsic stress of the formed layer and/or improve its electrical and electromigration properties. In one implementation, the metal ion source within the electrolyte solution is an ion source selected from a group comprising silver, tin, zinc, cobalt, nickel ion sources, and combinations thereof. In one implementation, the concentration of silver (Ag), tin (Sn), zinc (Zn), cobalt (Co), or nickel (Ni) ions in the electrolyte may range from about 0.1 M to about 0.4M.

Examples of suitable nickel sources include nickel sulfate, nickel chloride, nickel acetate, nickel phosphate, derivatives thereof, hydrates thereof or combinations thereof.

Examples of suitable tin sources include soluble tin compounds. A soluble tin compound can be a stannic or stannous salt. The stannic or stannous salt can be a sulfate, an alkane sulfonate, or an alkanol sulfonate. For example, the bath soluble tin compound can be one or more stannous alkane sulfonates of the formula:

where R is an alkyl group that includes from one to twelve carbon atoms. The stannous alkane sulfonate can be stannous methane sulfonate with the formula:

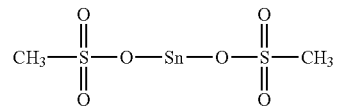

and the bath soluble tin compound can also be stannous sulfate of the formula: $SnSO_4$.

Examples of the soluble tin compound can also include tin(II) salts of organic sulfonic acid such as methanesulfonic acid, ethanesulfonic acid, 2-propanolsulfonic acid, p-phenolsulfonic acid and like, tin(II) borofluoride, tin(II) sulfosuccinate, tin(II) sulfate, tin(II) oxide, tin(II) chloride and the like. These soluble tin(II) compounds may be used alone or in combination of two or more kinds.

Example of suitable cobalt sources may include cobalt salts selected from cobalt sulfate, cobalt nitrate, cobalt chloride, cobalt bromide, cobalt carbonate, cobalt acetate, ethylene diamine tetraacetic acid cobalt, cobalt (II) acetyl acetonate, cobalt (III) acetyl acetonate, glycine cobalt (III), cobalt pyrophosphate, and combinations thereof.

The plating solution may also contain manganese or iron at a concentration within a range from about 20 ppm to about 600 ppm. In another implementation, the plating solution may contain manganese or iron at a concentration within a range from about 100 ppm to about 400 ppm. Possible iron sources include iron(II) chloride ($FeCl_2$) including hydrates, iron (III) chloride ($FeCl_3$), iron (II) oxide (FeO), Iron (II, III) oxide ($Fe_3O_4$), and Iron (III) oxide ($Fe_2O_3$). Possible manganese sources include manganese (IV) oxide ($MnO_2$), manganese (II) sulfate monohydrate ($MnSO_4.H_2O$), manganese (II) chloride ($MnCl_2$), manganese (III) chloride ($MnCl_3$), manganese fluoride ($MnF_4$), and manganese phosphate ($Mn_3(PO_4)_2$).

In some implementations, the plating solution contains free copper ions in place of copper source compounds and complexed copper ions.

In some implementations, the plating solution may also comprise at least one complexing agent or chelator to form complexes with the copper ions while providing stability and control during the deposition process. Complexing agents also provide buffering characteristics for the electroless copper solution. Complexing agents generally have functional groups, such as carboxylic acids, dicarboxylic acids, polycarboxylic acids, amino acids, amines, diamines or polyamines. Specific examples of useful complexing agents for the electroless copper solution include ethylene diamine tetraacetic acid (EDTA), ethylene diamine (EDA), citric acid, citrates, glyoxylates, glycine, amino acids, derivatives thereof, salts thereof or combinations thereof. In one implementation, the plating solution may have a complexing agent at a concentration within a range from about 50 mM to about 500 mM. In another implementation, the plating solution may have a complexing agent at a concentration within a range from about 75 mM to about 400 mM. In yet another implementation, the plating solution may have a complexing agent at a concentration within a range from about 100 mM to about 300 mM, such as about 200 mM. In one implementation, an EDTA source is used as the complexing agent within the plating solution. In one example, the plating solution contains about 205 mM of an EDTA source. The EDTA source may include EDTA, ethylenediaminetetraacetate, salts thereof, derivatives thereof or combinations thereof.

In certain implementations, the plating solution contains at least one reductant. Reductants provide electrons to induce the chemical reduction of copper ions while forming and depositing the copper material, as described herein. Reductants include organic reductants (e.g., glyoxylic acid or formaldehyde), hydrazine, organic hydrazines (e.g., methyl hydrazine), hypophosphite sources (e.g., hypophosphorous acid ($H_3PO_2$), ammonium hypophosphite (($NH_4)_{4-x}H_xPO_2$) or salts thereof), borane sources (e.g., dimethylamine borane complex (($CH_3)_2NHBH_3$), DMAB), trimethylamine borane complex (($CH_3)_3NBH_3$), TMAB), tert-butylamine borane complex ($tBuNH_2BH_3$), tetrahydrofuran borane complex ($THFBH_3$), pyridine borane complex ($C_5H_5NBH_3$), ammonia borane complex ($NH_3BH_3$), borane ($BH_3$), diborane ($B_2H_6$), derivatives thereof, complexes thereof, hydrates thereof or combinations thereof. In one implementation, the plating solution may have a reductant at a concentration within a range from about 20 mM to about 500 mM. In another implementations, the plating solution may have a reductant at a concentration within a range from about 100 mM to about 400 mM. In yet another implementations, the plating solution may have a reductant at a concentration within a range from about 150 mM to about 300 mM, such as about 220 mM. Preferably, an organic reductant or organic-containing reductant is utilized within the plating solution, such as glyoxylic acid or a glyoxylic acid source. The glyoxylic acid source may include glyoxylic acid, glyoxylates, salts thereof, complexes thereof, derivatives thereof or combinations thereof. In one example, glyoxylic acid monohydrate ($HCOCO_2H.H_2O$) is contained within the electroless copper solution at a concentration of about 217 mM.

The plating solution may contain other additives, which may be, for example, levelers, inhibitors, suppressors, brighteners, accelerators, or other additives known in the art, are typically organic materials that adsorb onto the surface of the substrate being plated. Useful suppressors typically include polyethers, such as polyethylene, glycol, or other polymers, such as polypropylene oxides, which adsorb on the substrate surface, slowing down copper deposition in the adsorbed areas. Useful accelerators typically include sulfides or disulfides, such as bis(3-sulfopropyl) disulfide, which compete with suppressors for adsorption sites, accelerating copper deposition in adsorbed areas. Useful inhibitors typically include sodium benzoate and sodium sulfite, which inhibit the rate of copper deposition on the substrate. During plating, the additives are consumed at the substrate surface, but are being constantly replenished by the electroplating solution. However, differences in diffusion rates of the various additives result in different surface concentrations at the top and the bottom of the features, thereby setting up different plating rates in the features. Ideally, these plating rates should be higher at the bottom of the feature for bottom-up fill. Thus, an appropriate composition of additives in the plating solution is may be used to achieve a void-free fill of the features.

The plating solution may also have a surfactant. The surfactant acts as a wetting agent to reduce the surface tension between the copper containing solution and the substrate surface. In one implementation, the plating solution generally contains a surfactant at a concentration of about 1,000 ppm or less. In another implementation, the plating solution generally contains a surfactant at a concentration of about 500 ppm or less, such as within a range from about 100 ppm to about 300 ppm. The surfactant may have ionic or non-ionic characteristics. Exemplary surfactants include glycol ether based surfactants, such as polyethylene glycol (PEG), polypropylene glycol (PPG) or the like. Due to beneficial characteristics, PEG and PPG may be used as a surfactant, an inhibitor and/or a suppressor. In one example, a glycol ether based surfactant may contain polyoxyethylene units, such as TRITON® 100, available from The Dow Chemical Company. Other surfactants that may be used within the electroless copper solution include dodecyl sulfates, such as sodium dodecyl sulfate (SDS). The surfactants may be single compounds or a mixture of compounds having molecules that contain varying lengths of hydrocarbon chains.

The balance or remainder of the plating solution described above may be a solvent, such as a polar solvent, including water, such as deionized water, and organic solvents, for example, alcohols or glycols.

In one implementation, the plating solution comprises 220 g/L of $CuSO_4$, 27 ml/L of $H_2SO_4$, a drop of HCl, and the remainder DI water to 1 L.

EXAMPLE

The following non-limiting example is provided to further illustrate implementations described herein. However, the example is not intended to be all inclusive and is not intended to limit the scope of the implementations described herein.

Example 1

A silicon coupon measuring 8 cm×8 cm was positioned in a plating cell similar to the plating cell position in FIG. 3. A front side of the silicon coupon was exposed to a plating solution comprising 220 g/L of $CuSO_4$, 27 ml/L of $H_2SO_4$, a drop of HCl, and the remainder DI water to 1 L. The backside of the silicon coupon was exposed to a wet contact solution comprising a hydrofluoric acid solution, aqueous, (49%) and potassium fluoride. An electric current density of 0.005 ampere per square centimeter ($A/cm^2$) and a potential of between 1.24 to 1.3 volts was applied for a period of approximately four minutes. A thin copper layer was deposited on the silicon coupon successfully demonstrating that copper could be plated on silicon using a wet back side contact.

While the foregoing is directed to implementations of the present disclosure, other and further implementations of the disclosure may be devised without departing from the basic scope thereof, and the scope thereof is determined by the claims that follow.

The invention claimed is:

1. A method for depositing a material on a substrate, comprising:
   depositing a metal seed layer on an exposed silicon contact surface at a bottom of an aperture on a silicon substrate;
   exposing a backside of the substrate to a potassium hydroxide solution while exposing the metal seed layer to a copper containing solution, wherein the substrate separates the potassium hydroxide solution from the copper containing solution; and
   flowing a current through the substrate to form a metal layer on the metal seed layer.

2. The method of claim 1, wherein flowing a current through the substrate to form a metal layer comprises filling the aperture with the metal layer.

3. The method of claim 1, wherein the metal of the metal seed layer is selected from cobalt and nickel.

4. The method of claim 3, wherein the metal of the metal seed layer is nickel deposited by an electroless process.

5. The method of claim 3, wherein the metal of the metal seed layer is cobalt deposited by either an electroless or a chemical vapor deposition process.

6. The method of claim 1, wherein the metal of the metal layer is copper.

7. A method for depositing a material on a substrate, comprising:
   depositing a metal seed layer on an exposed silicon contact surface at the bottom of an aperture on a silicon substrate;
   exposing a backside of the substrate to a hydrofluoric acid solution while exposing the metal seed layer to a copper containing solution, wherein the substrate separates the hydrofluoric acid solution from the copper containing solution; and
   flowing a current through the substrate to form a metal layer on the metal seed layer.

8. A method for depositing a material on a substrate, comprising:
   depositing a conformal barrier layer over a field region of a silicon substrate, at least one sidewall of a feature extending from the field region toward a backside of the silicon substrate and a bottom surface of the feature;
   removing a portion of the conformal barrier layer from the bottom surface of the feature to expose the silicon substrate;
   depositing a metal seed layer on the exposed silicon substrate at the bottom of the feature;
   exposing the backside of the substrate to a contact solution while exposing the metal seed layer to a copper containing solution, wherein the substrate separates the contact solution from the copper containing solution; and
   flowing a current through the silicon substrate to form a metal layer on the metal seed layer.

9. The method of claim 8, further comprising forming an oxide containing layer over the field region of the silicon substrate prior to depositing a conformal barrier layer over the field region, the at least one sidewall, and the bottom surface of the feature.

10. The method of claim 8, wherein the contact solution comprises a hydrofluoric acid solution.

11. The method of claim 10, wherein the contact solution further comprises potassium fluoride.

12. The method of claim 8, wherein the barrier layer comprises a tantalum nitride barrier layer.

13. The method of claim 12, wherein the barrier layer further comprises a silicon dioxide layer and the silicon dioxide layer is positioned under the tantalum nitride barrier layer.

14. The method of claim 8, wherein the contact solution comprises a potassium hydroxide solution.

* * * * *